United States Patent
Kuells et al.

(10) Patent No.: US 11,629,047 B2
(45) Date of Patent: Apr. 18, 2023

(54) METHOD FOR DETECTING CONTAMINATION OF A MEMS SENSOR ELEMENT

(71) Applicant: Robert Bosch GmbH, Stuttgart (DE)

(72) Inventors: Robert Kuells, Reutlingen (DE); Felix Springer, Reutlingen (DE); Martin Kittel, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 163 days.

(21) Appl. No.: 17/209,748

(22) Filed: Mar. 23, 2021

(65) Prior Publication Data

US 2021/0300751 A1 Sep. 30, 2021

(30) Foreign Application Priority Data

Mar. 26, 2020 (DE) .......................... 102020203910.0

(51) Int. Cl.
*B81B 7/00* (2006.01)
*B81B 7/02* (2006.01)

(52) U.S. Cl.
CPC .......... *B81B 7/0087* (2013.01); *B81B 7/0096* (2013.01); *B81B 7/02* (2013.01); *B81B 2201/0264* (2013.01); *B81B 2207/03* (2013.01)

(58) Field of Classification Search
None
See application file for complete search history.

(56) References Cited

U.S. PATENT DOCUMENTS

| | | | |
|---|---|---|---|
| 7,738,158 B2 * | 6/2010 | Natarajan ............. | B81B 3/0005 359/290 |
| 7,918,135 B2 * | 4/2011 | Hammerschmidt .. | G01L 9/0052 73/718 |
| 10,935,565 B2 * | 3/2021 | Steiner ...................... | B81B 7/02 |
| 11,337,010 B2 * | 5/2022 | Piechocinski .......... | H04R 19/04 |
| 2021/0116405 A1 * | 4/2021 | Mitsuhashi .......... | G01N 27/129 |

FOREIGN PATENT DOCUMENTS

| | | |
|---|---|---|
| DE | 102005029841 A1 | 3/2006 |
| DE | 102008002579 A1 | 12/2009 |
| DE | 102010001153 A1 | 9/2010 |
| DE | 102011081923 A1 | 2/2013 |
| DE | 102018102034 A1 | 8/2019 |
| WO | 2010130487 A1 | 11/2010 |

* cited by examiner

*Primary Examiner* — Octavia Davis Hollington
*Assistant Examiner* — Jermaine L Jenkins
(74) *Attorney, Agent, or Firm* — Norton Rose Fulbright US LLP; Gerard Messina

(57) ABSTRACT

A method for detecting contamination of a microelectromechanical sensor element. The method includes the following steps: outputting heating control signals for controlling a heating device in order to heat the sensor element, receiving measuring signals that represent a physical variable that is measured with the aid of the heated sensor element, ascertaining, based on the measured physical variable, whether the sensor element has contamination or is free of contamination, outputting result signals that represent a result indicating whether the sensor element has contamination or is free of contamination. Moreover, a device is described.

13 Claims, 4 Drawing Sheets

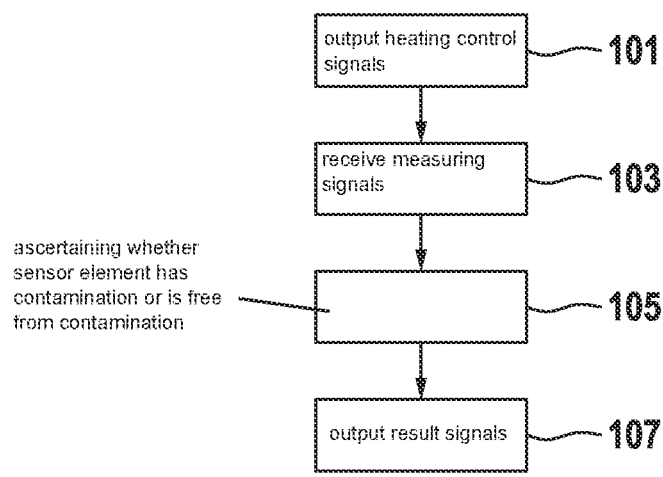
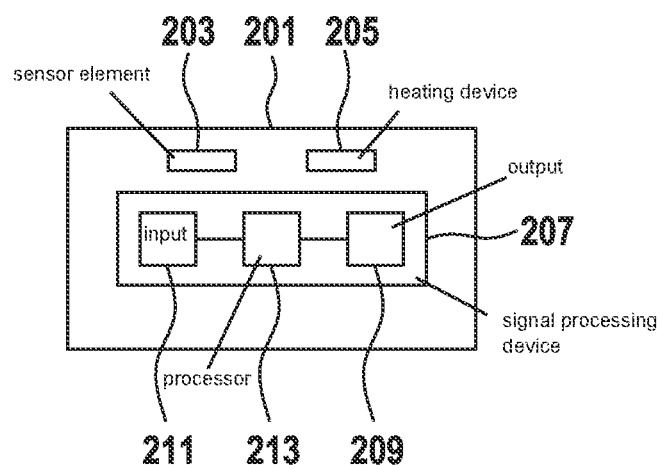

METHOD FOR DETECTING CONTAMINATION OF A MEMS SENSOR ELEMENT

CROSS REFERENCE

The present application claims the benefit under 35 U.S.C. § 119 of German Patent Application No. DE 102020203910.0 filed on Mar. 26, 2020, which is expressly incorporated herein by reference in its entirety.

FIELD

The present invention relates to a method for detecting contamination of a microelectromechanical sensor element. Moreover, the present invention relates to a device.

BACKGROUND INFORMATION

Media-robust and/or watertight MEMS pressure sensors that obtain this property via a gel covering of the sensing element or of the entire component are available on the market. They are used in mobile telephones or smart watches, for example, for measuring the air pressure, and are thus exposed to various environmental influences and media in liquid or solid form.

The protective gel is in direct contact with the sensing element on the one hand, and with the surroundings on the other hand. If the sensor, more precisely the gel surface, comes into contact with water, other liquids, or contaminants in general, this may possibly result in an influence on the pressure sensor output signal. The changes in the sensor signal may take place by chemical, electrical, or mechanical interaction of the gel with the contaminant. It is irrelevant whether a direct influence on the sensor signal results from the contamination, or whether a secondary interaction due to altered gel properties is present. The accuracy of the sensor may be poorer than required.

Since these sensors are provided in particular for use in watertight terminals, contamination with water is typical. Water frequently remains on the sensor after the device has been removed from the water.

As the result of contamination, sensor behavior may no longer correspond to a specification, or the sensor may be completely unusable.

Therefore, there is a need for detecting contamination of a microelectromechanical sensor element.

German Patent Application No. DE 10 2008 002 579 A1 describes a microelectromechanical sensor element.

German Patent Application No. DE 10 2005 029 841 A1 describes a micromechanical device including an integrated heater.

SUMMARY

An object of the present invention is to provide efficient detection of contamination of a microelectromechanical sensor element.

This object may achieved with an example embodiment of the present invention. Advantageous embodiments of the present invention are disclosed herein.

According to a first aspect, the present invention provides a method for detecting contamination of a microelectromechanical sensor element. In accordance with an example embodiment of the present invention, the method includes the following steps:

outputting heating control signals for controlling a heating device in order to heat the sensor element, receiving measuring signals that represent a physical variable that is measured with the aid of the heated sensor element, ascertaining, based on the measured physical variable, whether the sensor element has contamination or is free of contamination, outputting result signals that represent a result indicating whether the sensor element has contamination or is free of contamination.

According to a second aspect, in accordance with an example embodiment of the present invention, a device is provided for detecting contamination of a microelectromechanical sensor element, including:

a microelectromechanical sensor element, a heating device that is configured to heat the microelectromechanical sensor element, and a signal processing device, the signal processing device including an output that is configured to output heating control signals for controlling the heating device in order to heat the sensor element, the signal processing device including an input that is configured to receive measuring signals that represent a physical variable that is measured with the aid of the heated sensor element, the signal processing device including a processor that is configured to ascertain, based on the measured physical variable, whether the sensor element has contamination or is free of contamination, the output being configured to output result signals that represent a result indicating whether the sensor element has contamination or is free of contamination.

The present invention is based on and incorporates the finding that the above-mentioned object may be achieved by warming or heating the sensor element, the sensor element measuring a physical variable in the warmed state or in the heated state.

Based on this measured physical variable, it is ascertained whether the sensor element has contamination or is free of contamination. A corresponding result is output.

If the sensor element has contamination, this will have an effect on the measuring operation, i.e., on the measurement of the physical variable.

In addition, a thermal behavior, in particular a heat transport behavior, of the sensor element changes if the sensor element has contamination.

Thermal surroundings conditions of the sensor element generally have an effect on the measurement of the physical variable. This means that the measured physical variable is a function in particular of the thermal surroundings conditions.

Thus, the thermal surroundings conditions of the sensor element may be influenced by heating the sensor element, which is in turn reflected in the measured physical variable.

It may thus be efficiently ascertained, based on the measured physical variable, whether the sensor element has contamination or is free of contamination.

This yields in particular the technical advantage that a concept for efficiently detecting contamination of a microelectromechanical sensor element is provided.

In particular, the abbreviation MEMS may be used for the term "microelectromechanical system."

The sensor element is, for example, an element that is selected from the following group of sensor elements: pressure sensor, temperature sensor, gas sensor, voltage sensor, current sensor, resistance sensor, video sensor, LIDAR sensor, ultrasonic sensor, magnetic field sensor, infrared sensor, and radar sensor.

According to one specific embodiment of the present invention, it is provided that the sensor element is protected with the aid of a protective layer. For example, the sensor element is covered with the aid of a protective layer. Thus, according to one specific embodiment the sensor element is provided with a protective layer.

According to one specific embodiment of the present invention, a protective layer includes a gel.

A contaminant may thus in particular deposit on the gel.

The statement that the sensor element is free of contamination encompasses in particular that the gel is free of contamination.

The statement that the sensor element has contamination encompasses in particular that the gel has contamination.

If the sensor element is a pressure sensor, the measured physical variable is a pressure.

If the sensor element is a temperature sensor, the measured physical variable is a temperature.

According to one specific embodiment of the present invention, a contaminant encompasses a fluid and/or dust and/or a solid and/or a biofilm.

According to one specific embodiment of the present invention, a fluid encompasses water and/or one or multiple other liquids.

According to one specific embodiment of the present invention, it is provided that temperature signals that represent a sensor element temperature and/or a surroundings temperature of the sensor element are received, the ascertainment of whether the sensor element has contamination or is free of contamination being carried out based on the temperature signals.

This yields the technical advantage, for example, that the ascertainment of whether the sensor element has contamination or is free of contamination may be efficiently carried out.

As a result of the sensor element temperature and/or a surroundings temperature being known, the thermal surroundings conditions or a thermal behavior, in particular a heat transport behavior, of the sensor element may be efficiently ascertained.

Since the thermal surroundings conditions or the heat transport behavior have/has an effect on the measured physical variable, it may be efficiently ascertained whether the sensor element has contamination or is free of contamination.

According to one specific embodiment of the present invention, it is provided that reference signals that represent a physical reference variable are received, the ascertainment of whether the sensor element has contamination or is free of contamination being carried out based on the physical reference variable.

This may yield a technical advantage, for example, that the ascertainment of whether the sensor element has contamination or is free of contamination may be efficiently carried out.

For example, the physical reference variable has been measured under known conditions, in particular known thermal surroundings conditions, with the aid of an electromechanical sensor element, in particular with the aid of the microelectromechanical sensor element. In particular, the sensor element had no contamination during measurement of the physical reference variable. This means that the sensor element was free of contamination during measurement of the physical reference variable.

This means in particular that if the measured physical variable deviates from the physical reference variable, in particular within a predetermined tolerance range, it may be determined that the sensor element has contamination.

If the deviation is within the predetermined tolerance range, for example, it is determined, for example, that the sensor element is free of contamination; otherwise, it is determined, for example, that the sensor element has contamination.

This means in particular that according to one specific embodiment of the present invention, it is provided that a deviation of the measured physical variable from the physical reference variable is ascertained, the ascertainment of whether the sensor element has contamination or is free of contamination being carried out based on the ascertained deviation.

The physical reference variable and the measured physical variable have the same physical units.

In one specific embodiment of the present invention, it is provided that the measured physical variable encompasses a temporal profile of the physical variable.

In one specific embodiment of the present invention, it is provided that the physical reference variable encompasses a temporal profile of the physical reference variable.

According to one specific embodiment of the present invention, it is provided that when it is ascertained that the sensor element has contamination, the type of contamination is ascertained, the result additionally indicating the type of contamination.

This yields the technical advantage, for example, that suitable countermeasures may be taken, depending on the type of contamination.

If the contamination encompasses a fluid, in particular water, for example a drying operation may be recommended or initiated or carried out.

If, for example, the contamination encompasses dust, for example a cleaning operation may be recommended or initiated or carried out.

According to one specific embodiment of the present invention, the ascertainment of the type of contamination is carried out based on the measured physical variable and/or based on the temperature signals and/or based on the physical reference variable.

According to one specific embodiment of the present invention, it is provided that a water contact signal that represents a detected contact of the surroundings of the sensor element with water is received, the ascertainment of the type of contamination including establishing that the type of contamination encompasses water.

This may yield a technical advantage, for example, that the type of contamination may be efficiently ascertained.

According to one specific embodiment of the present invention, it is provided that when it is ascertained that the sensor element has contamination, control signals for controlling a contamination elimination process are output.

This may yield a technical advantage, for example, that the contamination may be efficiently eliminated.

According to one specific embodiment of the present invention, it is provided that the control signals are output based on the ascertained type of contamination.

This may yield a technical advantage, for example, that the contamination may be efficiently eliminated.

According to one specific embodiment of the present invention, it is provided that when the contamination encompasses water and/or a fluid and/or a biofilm, the control signals encompass drying heat control signals for controlling the heating device in order to dry the sensor element by heating, and/or when the contamination encompasses dust and/or a solid and/or a biofilm, the control signals encompass cleaning control signals for controlling a cleaning device in order to clean the sensor element.

This may yield a technical advantage, for example, that the contamination may be efficiently eliminated.

According to one specific embodiment of the present invention, it is provided that the sensor element is encompassed by a device that includes a water detection device that is configured to detect a contact of the device with water, and to output a water contact signal when a contact of the device with water is detected, the ascertainment of the type of contamination being carried out as a function of whether or not a water contact signal has been received.

This may yield a technical advantage, for example, that the type of contamination may be efficiently ascertained.

If, for example, no water contact signal has been received, it is determined, for example, that the contamination does not encompass fluid, in particular does not encompass water.

If, for example, a water contact signal has been received, it is determined, for example, that the contamination encompasses a fluid, in particular water.

According to one specific embodiment of the present invention, the sensor element is encompassed by a device.

According to one specific embodiment of the present invention, the device includes a water detection device.

According to one specific embodiment of the present invention, the water detection device is configured to detect a contact of the device with water, and to output a water contact signal when a contact of the device with water is detected.

According to one specific embodiment of the present invention, the device includes charging electronics.

According to one specific embodiment of the present invention, the device is an element selected from the following group of devices: terminal, in particular a mobile telephone, smart watch, computer, laptop, tablet, satellite navigation device.

According to one specific embodiment of the present invention, it is provided that the sensor element is situated within a housing.

According to one specific embodiment of the present invention, the device encompasses the housing.

According to one specific embodiment of the present invention, it is provided that the heating device includes one or multiple heating elements.

According to one specific embodiment of the present invention, it is provided that the sensor element includes a heating element.

According to one specific embodiment of the present invention, it is provided that a heating element is integrated into the sensor element.

According to one specific embodiment of the present invention, it is provided that a heating element is situated at an outer surface of the sensor element.

According to one specific embodiment of the present invention, it is provided that the housing includes a heating element.

According to one specific embodiment of the present invention, it is provided that a heating element is integrated into the housing.

According to one specific embodiment of the present invention, it is provided that a surface of the housing is provided with a heating element.

According to one specific embodiment of the present invention, it is provided that a heating element is situated at a surface of the housing.

According to one specific embodiment of the present invention, it is provided that the sensor element is situated on a circuit board.

According to one specific embodiment of the present invention, it is provided that the circuit board includes a heating element.

According to one specific embodiment of the present invention, it is provided that the sensor element is situated on a substrate or carrier.

According to one specific embodiment of the present invention, it is provided that the substrate or the carrier includes a heating element.

If the singular is used for the heating element, the plural is always to be inferred, and vice versa.

According to one specific embodiment of the present invention, it is provided that the sensor element is encompassed by a device that includes a water detection device that is configured to detect a contact of the device with water, and to output a water contact signal when a contact of the device with water is detected, the input being configured to receive the water contact signal, the processor being configured to carry out the ascertainment of the type of contamination as a function of whether or not a water contact signal has been received.

One specific embodiment of the present invention encompasses a contamination elimination device that is configured to carry out a contamination elimination process, the output being configured to output control signals for controlling the contamination elimination device in order to carry out a contamination elimination process.

According to one specific embodiment of the present invention, it is provided that the contamination elimination device includes one or more of the following: the heating device, a piezo element for acting on the sensor element with vibrations.

One specific embodiment of the present invention encompasses a memory in which a physical reference variable is stored, the physical reference variable and the measured physical variable having the same physical units, the input being configured to receive reference signals from the memory that represent the physical reference variable, the processor being configured to carry out the ascertainment of whether the sensor element has contamination or is free of contamination, based on the physical reference variable, the processor being configured to ascertain a deviation of the measured physical variable from the physical reference variable, the processor being configured to carry out the ascertainment of whether the sensor element has contamination or is free of contamination, based on the ascertained deviation.

Advantages that are described in conjunction with the method analogously apply for corresponding specific embodiments of the device, and vice versa.

According to one specific embodiment of the present invention, it is provided that the method according to the first aspect is a computer-implemented method.

According to one specific embodiment of the present invention, it is provided that the method according to the first aspect is executed or carried out with the aid of the device according to the second aspect.

Device features analogously result from corresponding method features, and vice versa. This means in particular that technical functionalities of the device analogously result from corresponding technical functionalities of the method, and vice versa.

In one specific embodiment of the present invention, it is provided that the device according to the second aspect is configured to carry out all steps of the method according to the first aspect.

Exemplary embodiments of the present invention are illustrated in the figures and explained in greater detail below.

BRIEF DESCRIPTION OF THE DRAWINGS

FIG. 1 shows a flowchart of a method for detecting contamination of a microelectromechanical sensor element, in accordance with an example embodiment of the present invention.

FIG. 2 shows a device, in accordance with an example embodiment of the present invention.

The same reference numerals may be used for identical features in the following discussion.

DETAILED DESCRIPTION OF EXAMPLE EMBODIMENTS

Figure 3:
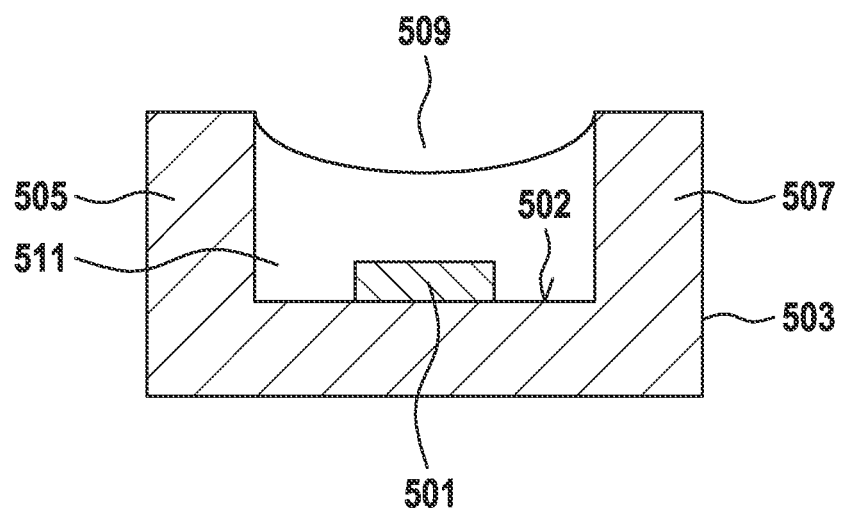
FIGS. 3 through 6 each show a microelectromechanical sensor element, in accordance with an example embodiment of the present invention.

FIG. 1 shows a flowchart of a method for detecting contamination of a microelectromechanical sensor element, in accordance with an example embodiment of the present invention. The method includes the following steps:

outputting 101 heating control signals for controlling a heating device in order to heat the sensor element, receiving 103 measuring signals that represent a physical variable that is measured with the aid of the heated sensor element, ascertaining 105, based on the measured physical variable, whether the sensor element has contamination or is free of contamination, outputting 107 result signals that represent a result indicating whether the sensor element has contamination or is free of contamination.

In one specific embodiment of the present invention, the method according to the first aspect encompasses a measurement of the physical variable, in particular a measurement of a temporal profile of the physical variable.

FIG. 2 shows a device 201 for detecting contamination 601, 701 of a microelectromechanical sensor element 203, including:

a microelectromechanical sensor element 203, a heating device 205 that is configured to heat microelectromechanical sensor element 203, and a signal processing device 207, signal processing device 207 including an output 209 that is configured to output heating control signals for controlling heating device 205 in order to heat sensor element 203, signal processing device 207 including an input 211 that is configured to receive measuring signals that represent a physical variable that is measured with the aid of heated sensor element 203, signal processing device 207 including a processor 213 that is configured to ascertain, based on the measured physical variable, whether sensor element 203 has contamination 601, 701 or is free of contamination 601, 701, output 209 being configured to output result signals that represent a result indicating whether sensor element 203 has contamination 601, 701 or is free of contamination 601, 701.

FIG. 3 shows a microelectromechanical sensor element 501. Sensor element 501 is a pressure sensor, for example.

Sensor element 501 is situated on a base 502 of a housing 503.

Figure 4:
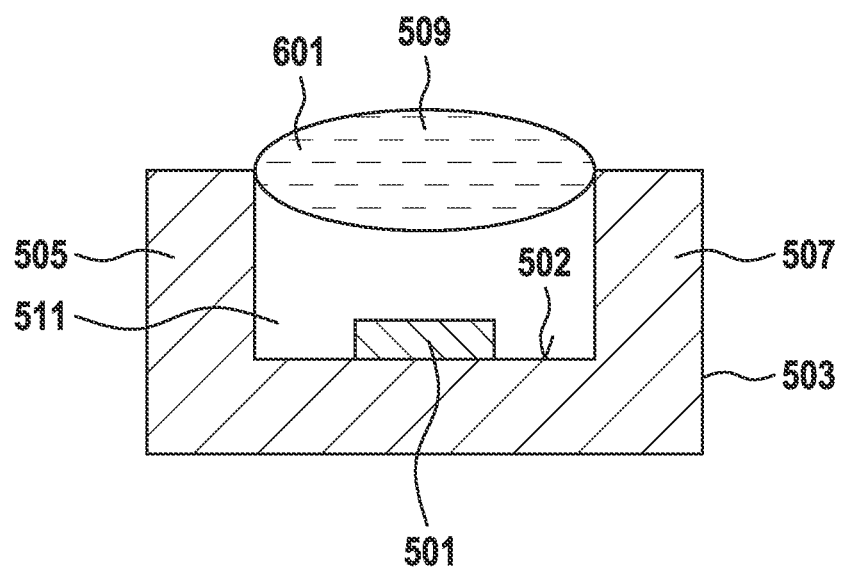
Figure 5:
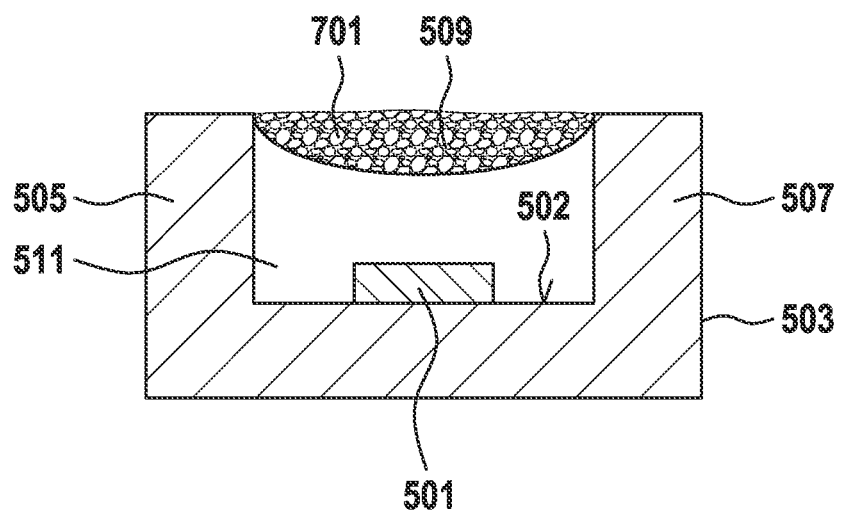
Figure 6:
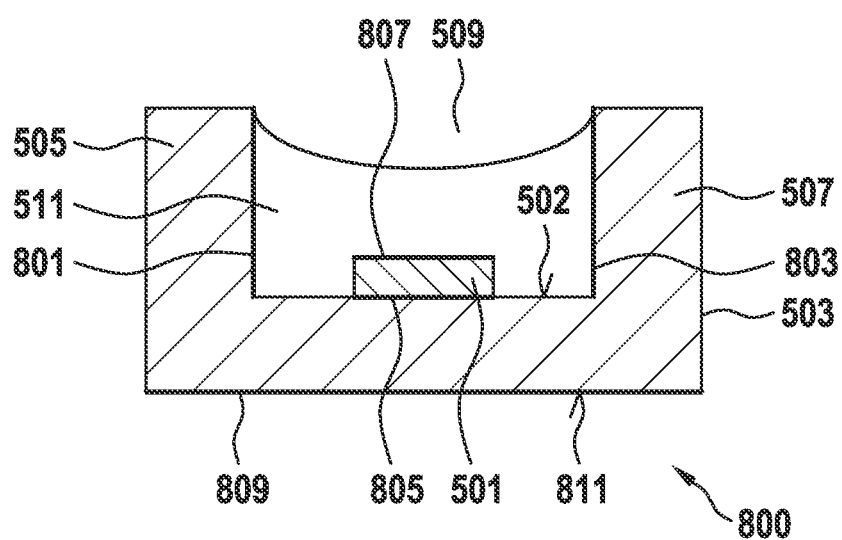

The view according to FIG. 3 and also according to FIGS. 4 through 6 is a cross-sectional view.

Two side walls of housing 503 situated opposite from one another are denoted by reference numerals 505, 507.

A cavity 509 in which sensor element 501 is situated is thus formed in housing 503.

Cavity 509 is partially filled with a protective layer 511 which may include a gel, for example.

It is provided that protective layer 511 completely covers sensor element 501.

In the illustration shown in FIG. 3, sensor element 501 is free of contamination, to the extent that no contamination is formed on protective layer 511.

FIG. 4 shows sensor element 501 together with protective layer 511, water 601 being situated on protective layer 511.

In this regard, sensor element 501 has contamination, in the present case, water.

FIG. 5 shows sensor element 501 including protective layer 511, dust 701 having deposited on protective layer 511.

In this regard, sensor element 501 has contamination, in the present case, dust 701.

FIG. 6 shows, in addition to the illustration shown in FIG. 3, a heating device 800 that includes multiple heating elements.

A first heating element 801 is situated at an inner surface of left side wall 505 (relative to the plane of the drawing) of housing 503.

A second heating element 803 is oppositely situated at an inner surface of right housing side wall 507.

A third heating element 805 is situated between sensor element 501 and base 502 of housing 503.

A fourth heating element 807 is situated on sensor element 501, i.e., on a side of sensor element 501 facing away from base 502.

In addition, a fifth heating element 809 is situated at a bottom side of housing 503. Bottom side 809 is the side of housing 503 facing away from base 502.

Figure 7:
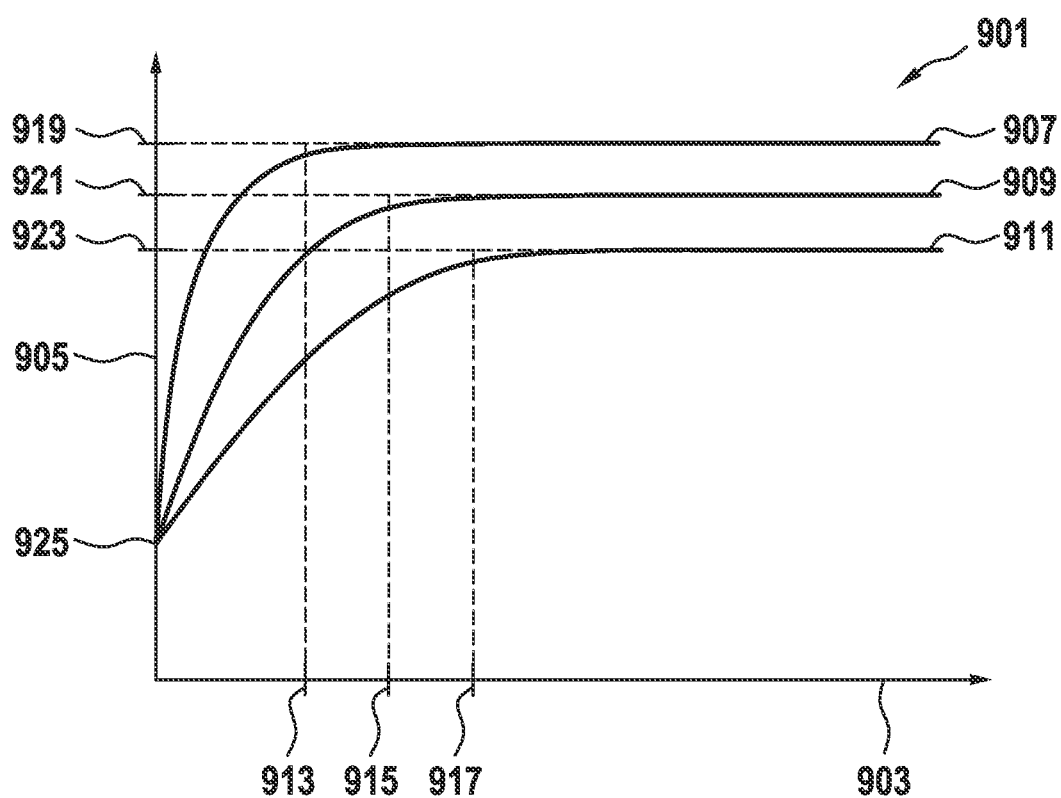
FIG. 7 shows a graph, in accordance with an example embodiment of the present invention.

FIG. 7 shows a graph 901.

Graph 901 includes an x axis 903 and a y axis 905.

x axis 903 indicates a time in arbitrary units.

y axis 905 indicates a measured physical variable of sensor element 501 in arbitrary units.

If sensor element 501 is a pressure sensor, for example, the measured physical variable corresponds to a pressure.

Three curves are depicted in graph 901: a first curve 907, a second curve 909, and a third curve 911.

The three curves 907, 909, 911 show a temporal response characteristic of a pressure signal of sensor element 501 corresponding to the measured pressure.

This temporal response characteristic is a function in particular of the thermal surroundings conditions and/or of a heat transport behavior of sensor element 501.

This means that the temporal response characteristic changes with different surroundings temperatures.

Thus, first curve 907 has been recorded at a first temperature. Second curve 909 has been recorded at a second temperature. Third curve 911 has been recorded at a third temperature. These temperatures represent a surroundings temperature of sensor element 501.

The first temperature is higher than the second temperature. The second temperature is higher than the third temperature.

A first time constant for first curve 907 denoted by reference numeral 913, a second time constant 915 for second curve 909, and a third time constant 917 for third curve 911 are plotted on x axis 903.

A first amplitude 919 for first curve 907, a second amplitude 921 for second curve 909, and a third amplitude 923 for third curve 911 are plotted on y axis 905. The three amplitudes 919, 921, and 923 are defined relative to an offset 925.

Due to the thermal dependency of the temporal response characteristic, the three time constants and the three amplitudes are different.

However, the temporal response characteristic also changes when the sensor element, in the present case in particular protective layer 511, is provided with contamination.

Thus, if the temporal response characteristic in the clean state is known, i.e., when the sensor element is free of contamination, by comparing a pressure measurement to these curves 907, 909, 911 it may be ascertained whether sensor element 501 is free of contamination or has contamination.

The concept described here is based, among other things, on the fact that when the heat transport behavior of a sensor element with internal heating is known, a contaminant, in particular water, on the sensor element, in particular on the protective layer surface, in particular on the gel surface, may be detected by utilizing a heat dissipation that is changed by contamination, in order to detect the presence of this contamination, in particular occupancy with water. For this purpose, it is provided, for example, that a heating device that is integrated into the sensor element or present in proximity to the sensor element is used to heat the sensor element and/or its surroundings above its present temperature within a defined time.

At the same time, for example a sensor element temperature is measured, and in particular a physical variable, for example a pressure, that is measured with the aid of the heated sensor element is measured. A temporal response characteristic, in particular characterized by a time constant and an amplitude, of the sensor element signal, in particular of the pressure signal, is a function in particular of the thermal surroundings conditions.

Provided that the sensor element, in particular the protective layer, in particular the gel surface, is free of contamination, for example is clean and dry, the thermal surroundings and the associated response characteristic are always the same. In this case, an occupancy with water or contamination in general results in an additional heat capacity and also an additional thermal contact resistance compared to an initially clean and dry state. In the thermal network this results in an altered temporal response characteristic, which has been measured beforehand and is used as a reference. Based on a difference between the reference measurement in the clean and dry state and a subsequent measurement, it is thus advantageously possible to deduce an occupancy with water or contamination in general.

For example, it is provided to trigger a cleaning and/or a drying based on a differentiation of various contaminants.

Since the thermal properties of different contaminants, in particular liquids, sometimes differ greatly, it is possible, in particular via a quantification of the thermal response characteristic, to distinguish between different occupancies of the sensor element. For example, if an observed signature (measured physical variable) matches a typical signature (physical reference variable) of a liquid, a drying step may be initiated. For example, if the signature is similar to a nonliquid contamination, for example a cleaning step may be triggered.

In addition, different contaminants may be distinguished or classified with the aid of a further measured variable. For example, many watertight terminals have a separate detection of a contact with water, for example for protection of the charging electronics. This separate detection is the separate water detection device described above. If contamination of the sensor element together with additional water contamination, detected by the separate water detection device, is detected, it is likely that water is present on the sensor element, and in this regard drying is advisable. If this additional signal, i.e., the water contact signal, is absent, some other type of soiling is thus more likely to be present, and cleaning, for example, may be triggered.

What is claimed is:

1. A method for detecting contamination of a microelectromechanical sensor element, comprising the following steps:
   outputting heating control signals to control a heating device to heat the sensor element;
   receiving measuring signals that represent a physical variable that is measured using the heated sensor element;
   ascertaining, based on the measured physical variable, whether the sensor element has contamination or is free of contamination; and
   outputting result signals that represent a result indicating whether the sensor element has contamination or is free of contamination,
   wherein reference signals that represent a physical reference variable are received, the physical reference variable and the measured physical variable having the same physical units, the ascertainment of whether the sensor element has contamination or is free of contamination being carried out based on the physical reference variable.

2. The method as recited in claim 1, wherein temperature signals that represent a sensor element temperature and/or a surroundings temperature of the sensor element are received, the ascertainment of whether the sensor element has contamination or is free of contamination being carried out based on the temperature signals.

3. A method for detecting contamination of a microelectromechanical sensor element, comprising the following steps:
   outputting heating control signals to control a heating device to heat the sensor element;
   receiving measuring signals that represent a physical variable that is measured using the heated sensor element;
   ascertaining, based on the measured physical variable, whether the sensor element has contamination or is free of contamination; and
outputting result signals that represent a result indicating whether the sensor element has contamination or is free of contamination,
   wherein reference signals that represent a physical reference variable are received, the physical reference variable and the measured physical variable having the same physical units, the ascertainment of whether the sensor element has contamination or is free of contamination being carried out based on the physical reference variable, a deviation of the measured physical variable from the physical reference variable being ascertained, the ascertainment of whether the sensor element has contamination or is free of contamination being carried out based on the ascertained deviation.

4. A method for detecting contamination of a microelectromechanical sensor element, comprising the following steps:
outputting heating control signals to control a heating device to heat the sensor element;
receiving measuring signals that represent a physical variable that is measured using the heated sensor element;
ascertaining, based on the measured physical variable, whether the sensor element has contamination or is free of contamination; and
outputting result signals that represent a result indicating whether the sensor element has contamination or is free of contamination,
wherein when the measured physical variable is ascertained that the sensor element has contamination, a type of contamination is ascertained, the result signals additionally indicating the type of contamination.

5. The method as recited in claim 4, wherein a water contact signal that represents a detected contact of surroundings of the sensor element with water is received, the ascertainment of the type of contamination including establishing that the type of contamination encompasses water.

6. The method as recited in claim 4, wherein when the measured physical variable is ascertained that the sensor element has contamination, control signals for controlling a contamination elimination process are output.

7. The method as recited in claim 6, wherein the control signals are output based on the ascertained type of contamination.

8. The method as recited in claim 7, wherein: (i) when the contamination encompasses water and/or a fluid and/or a biofilm, the control signals encompass drying heat control signals to control the heating device to dry the sensor element by heating, and/or (ii) when the contamination encompasses dust and/or a solid and/or a biofilm, the control signals encompass cleaning control signals to control a cleaning device to clean the sensor element.

9. A device for detecting contamination of a microelectromechanical sensor element, comprising:
a microelectromechanical sensor element;
a heating device configured to heat the microelectromechanical sensor element; and
a signal processing device, including:
an output configured to output heating control signals to control the heating device to heat the sensor element,
an input configured to receive measuring signals that represent a physical variable that is measured using the heated sensor element,
a processor configured to ascertain, based on the measured physical variable, whether the sensor element has contamination or is free of contamination,
wherein the output is configured to output result signals that represent a result indicating whether the sensor element has contamination or is free of contamination, and
a memory in which a physical reference variable is stored, the physical reference variable and the measured physical variable having the same physical units, the input being configured to receive reference signals from the memory that represent the physical reference variable, the processor being configured to carry out the ascertainment of whether the sensor element has contamination or is free of contamination, based on the physical reference variable.

10. The device as recited in claim 9, wherein the sensor element is encompassed by a device that includes a water detection device that is configured to detect a contact of the device with water, and to output a water contact signal when a contact of the device with water is detected, the input being configured to receive the water contact signal, the processor being configured to carry out an ascertainment of a type of contamination as a function of whether or not a water contact signal has been received.

11. The device as recited in claim 9, further comprising:
a contamination elimination device configured to carry out a contamination elimination process, the output being configured to output control signals for controlling the contamination elimination device to carry out a contamination elimination process.

12. The device as recited in claim 11, wherein the contamination elimination device includes one or more of the following: the heating device, a piezo element for acting on the sensor element with vibrations.

13. A device for detecting contamination of a microelectromechanical sensor element, comprising:
a microelectromechanical sensor element;
a heating device configured to heat the microelectromechanical sensor element; and
a signal processing device, including:
an output configured to output heating control signals to control the heating device to heat the sensor element,
an input configured to receive measuring signals that represent a physical variable that is measured using the heated sensor element,
a processor configured to ascertain, based on the measured physical variable, whether the sensor element has contamination or is free of contamination,
wherein the output is configured to output result signals that represent a result indicating whether the sensor element has contamination or is free of contamination, and
a memory in which a physical reference variable is stored, the physical reference variable and the measured physical variable having the same physical units, the input being configured to receive reference signals from the memory that represent the physical reference variable, the processor being configured to carry out the ascertainment of whether the sensor element has contamination or is free of contamination, based on the physical reference variable, the processor being configured to ascertain a deviation of the measured physical variable from the physical reference variable, the processor being configured to carry out the ascertainment of whether the sensor element has contamination or is free of contamination, based on the ascertained deviation.

* * * * *